United States Patent
Anderson

Patent Number: 6,122,336
Date of Patent: Sep. 19, 2000

[54] DIGITAL CLOCK RECOVERY CIRCUIT WITH PHASE INTERPOLATION

[75] Inventor: Michael B. Anderson, Colorado Springs, Colo.

[73] Assignee: LSI Logic Corporation, Milpitas, Calif.

[21] Appl. No.: 08/927,947

[22] Filed: Sep. 11, 1997

[51] Int. Cl.[7] .............................. H04L 25/40; H04L 7/00; H03D 3/24

[52] U.S. Cl. ........................... 375/371; 375/375; 327/153

[58] Field of Search ..................................... 375/371, 375, 375/376, 327; 327/144, 153, 161, 237, 263; 331/57, 186

[56] References Cited

U.S. PATENT DOCUMENTS

| | | | |
|---|---|---|---|
| 3,911,368 | 10/1975 | Tarczy-Hornoch | 327/237 |
| 4,216,544 | 8/1980 | Boleda et al. | 375/119 |
| 4,633,193 | 12/1986 | Scordo | 331/1 A |
| 4,744,096 | 5/1988 | Roux | 375/120 |
| 5,235,622 | 8/1993 | Yoshida | 375/106 |
| 5,485,490 | 1/1996 | Leung et al. | 375/371 |
| 5,502,750 | 3/1996 | Co et al. | 375/372 |
| 5,568,099 | 10/1996 | Du | 331/57 |

*Primary Examiner*—Stephen Chin
*Assistant Examiner*—Albert Park

[57] ABSTRACT

The present invention provides a digital clock recovery circuit, which includes a frequency synthesizer generating a number of clock phase signals. The digital clock recovery circuit also includes a phase interpolation unit, which interpolates the clock phase signals from the frequency synthesizer to increase the number of clock phase signals. Additionally, the digital clock recovery circuit also includes a phase detector, a digital filter, and a phase selection unit. The phase detector has an output connected to a digital filter, which is connected to the phase selection unit. The phase detector sends signals filtered through the digital filter to select clock phase signals input into the phase selection unit from the phase interpolation unit. The output of the phase selector provides the recovered clock signal and also connected to the input phase detector.

23 Claims, 6 Drawing Sheets

DIGITAL CLOCK RECOVERY CIRCUIT WITH PHASE INTERPOLATION

BACKGROUND OF THE INVENTION

1. Technical Field

The present invention relates generally to a recovery of a clock signal and in particular to a digital clock recovery circuit. Still more particularly, the present invention relates to a digital clock recovery circuit with phase interpolation.

2. Description of the Related Art

In digital clock recovery, the phase resolution of a digital clock recovery loop is determined by the number of clock phases available. This number of clock phases is usually set by the number of delay elements in a voltage controlled oscillator (VCO) in the form of a ring oscillator. For example, in FIG. 1, a block diagram of a known digital clock recovery circuit 100 is illustrated. Digital clock recovery circuit is in the form of a digital phase-locked loop (DPLL). Digital clock recovery circuit 100 includes a frequency synthesizer 102, a phase detector 104, a digital filter 106, and a phase selection unit 108. Frequency synthesizer 102 is employed to generate a plurality of clock phases. Phase selection unit 108 is employed to select one of the clock phases generated by frequency synthesizer 102 in response to inputs from phase detector 104 through digital filter 106.

Figure 1:
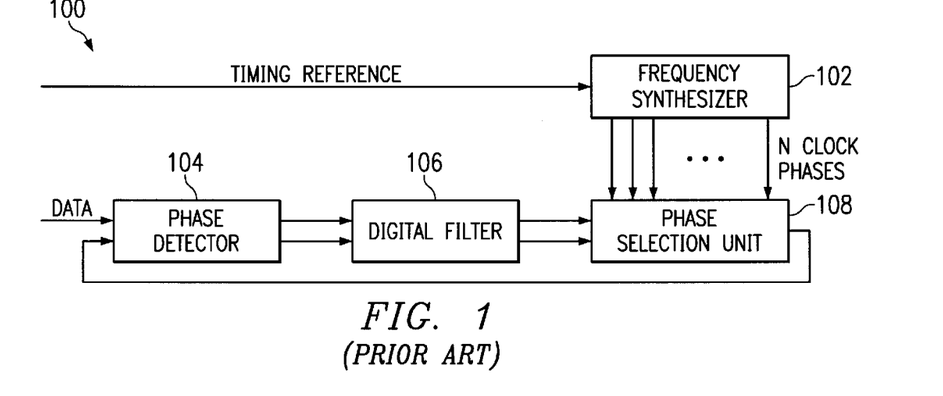
FIG. 1 is a block diagram of a known digital clock recovery circuit.

To increase resolution within digital clock recovery circuit 100, the number of delay elements within the ring oscillator in frequency synthesizer 102 needs to increase to raise the number of clock phases. The maximum of delay elements, however, may be limited to the frequency of the VCO in combination with the speed of technology. For example, with complimentary metal oxide semiconductor (CMOS) technologies, a limited number of elements may be used depending on the frequency at which the circuit is to run. For example, in a 0.5 micron CMOS technology, ten clock phases can be generated at 400 MHz. However, the task of providing ten clock phases while the frequency increases becomes more challenging, and ultimately reaches a technological limit. Moreover, ten clock phases may not be sufficient to achieve a specific resolution for a particular application. As a result, with current digital clock recovery circuits, the amount of resolution provided by a frequency synthesizer is limited as the frequency at which circuits run increase. Therefore, it would be advantageous to have an improved method and apparatus for recovering a clock signal.

SUMMARY OF THE INVENTION

The present invention provides a digital clock recovery circuit, which includes a frequency synthesizer generating a number of clock phase signals. The digital clock recovery circuit also includes a phase interpolation unit, which interpolates the clock phase signals from the frequency synthesizer to increase the number of clock phase signals. The digital clock recovery circuit also includes a phase detector, a digital filter, and a phase selection unit. The phase detector has an output connected to a digital filter, which is connected to the phase selection unit. The phase detector sends signals filtered through the digital filter to select clock phase signals input into the phase selection unit from the phase interpolation unit. The output of the phase selector provides the recovered clock signal and also connected to the input of the phase detector.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
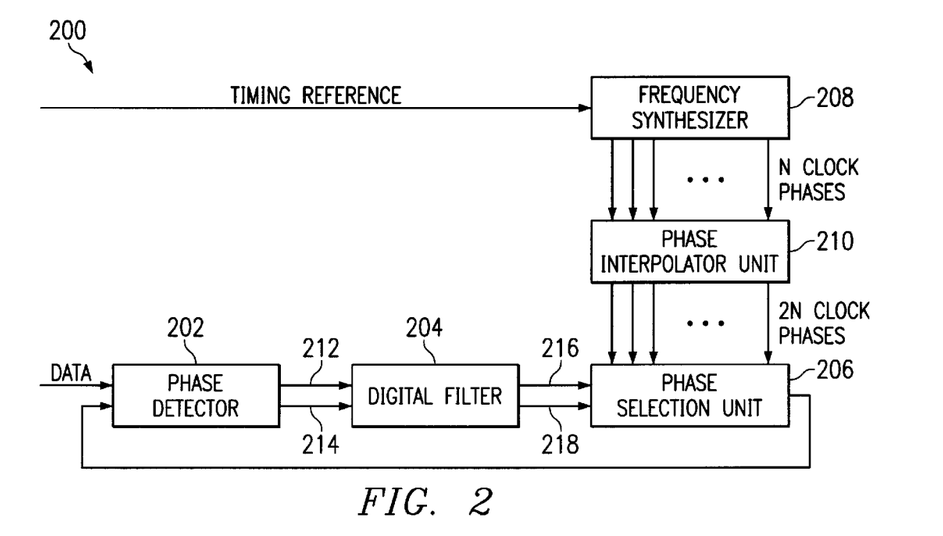
FIG. 2 is a block diagram of a digital clock recovery circuit with phase interpolation in accordance with a preferred embodiment of the present invention.

With reference now to the figures and in particular with reference to FIG. 2 is a block diagram of a digital clock recovery circuit with phase interpolation is illustrated in accordance with a preferred embodiment of the present invention. Digital clock recovery circuit 200 includes a phase detector 202, a digital filter 204, a phase selection unit 206, a frequency synthesizer 208, and a phase interpolation unit 210. Frequency synthesizer 208 includes a voltage controlled oscillator (VCO) (not shown) in the form of a ring oscillator that generates N clock phases in the depicted example. Frequency synthesizer 208 receives the timing reference, which is used by the VCO to generate N clock phases.

Phase interpolation unit 210 interpolates the N clock phases to generate some multiple of clock phases in the depicted example. This multiple of clock phases may be, for example, 2N, 4N, or 8N. If the number of clock phases is doubled from N to 2N, this doubling of the number of clock phases is accomplished by an array of phase interpolators located within phase interpolation unit 210. Additional increases in the number of clock phases may be accomplished by adding additional arrays of phase interpolators located within phase interpolation unit 210. Digital clock recovery circuit 200 employs phase interpolators within phase interpolation unit 210 to extend the resolution of digital clock recovery circuit 200. The clock phases set by the voltage controlled oscillator within frequency synthesizer 208 are interpolated to increase the number of clock phases. For example, if each clock phase generated by frequency synthesizer 208 is sent to the phase interpolator within the phase interpolators, the number of clock phases are doubled. Further, resolution can be achieved by interpolating the previously interpolated clock phases.

The output of phase section unit 206 is connected to an input in phase detector 202. Additionally, another input in phase detector 202 is connected to a data source. Phase detector 202 compares the data from the data source with the clock signal. If the clock signal leads the data, phase detector 202 sends an up signal through line 212 to digital filter 204. On the other hand, if the clock signal lags the data, then phase detector 202 sends a down signal through line 214 to digital filter 204. Digital filter 204 sends a sel_early signal through line 216 and a change_phase signal through line 218. The sel_early signal indicates to the phase selector to either advance one phase or delay one phase. This will occur when a positive edge signal is sent on the change_phase line 218. For example, after a predefined number of up signals from the phase detector are processed by the digital filter, the sel_early line will go to a logic high and a positive edge will be sent on the change_phase line. Conversely, after a predefined number of down signals from the phase detector are processed by the digital filter, the sel_early line will go to a logic low and a positive edge will be sent on the change_phase line. In this way, the phase of the recovered clock is advanced or delayed as the loop attempts to achieve the optimal sampling instant.

Figure 3:
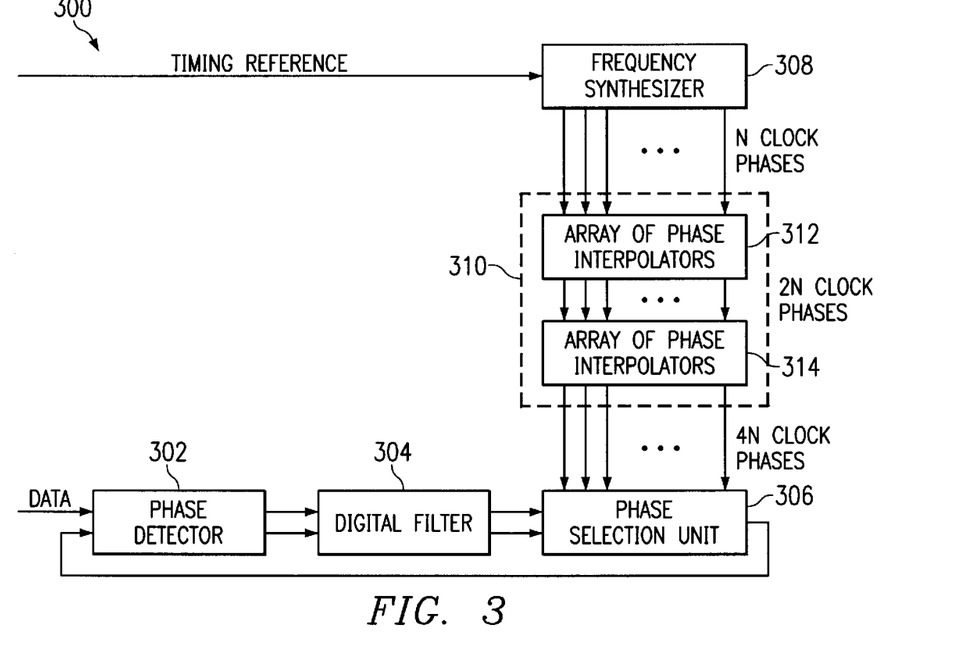
FIG. 3 is a block diagram of a digital clock recovery circuit with phase interpolation in accordance with a preferred embodiment of the present invention.

Turning next to FIG. 3, a block diagram of a digital clock recovery circuit with phase interpolation is depicted in accordance with a preferred embodiment of the present invention. Digital recovery circuit 300 contains a phase detector 302, a digital filter 304, a phase selection unit 306, a frequency synthesizer 308, and a phase interpolation unit 310. In the depicted example, phase interpolation unit 310 increases the N clock phases generated by frequency synthesizer 308 to 4N clock phases for selection by phase selection unit 306. This increase in the number of clock phases is accomplished two arrays of phase interpolators, array 312 and array 314. Array 312 receives N clock phases at its input from frequency synthesizer 308 and generates 2N clock phases at its output. The 2N clock phases are input into array 314, which generates 4N clock phases at its output. Additional clock phases may be generated by adding additional arrays for phase interpolators to phase interpolation unit 310. Thus, in the depicted example, phase interpolation unit 310 provides for two levels of phase interpolation. Of course, additional levels of phase interpolation may be employed to increase the number of clock phases to reach the desired number of clock phases.

To minimize power consumption within digital clock recovery circuit 300, the circuit can be designed such that only necessary phase interpolators within phase interpolation unit 310 are activated, depending on the number of clock phases desired. Additionally, a VCO with less delay cells may be designed because extra phases can be produced by phase interpolation.

Figure 4:
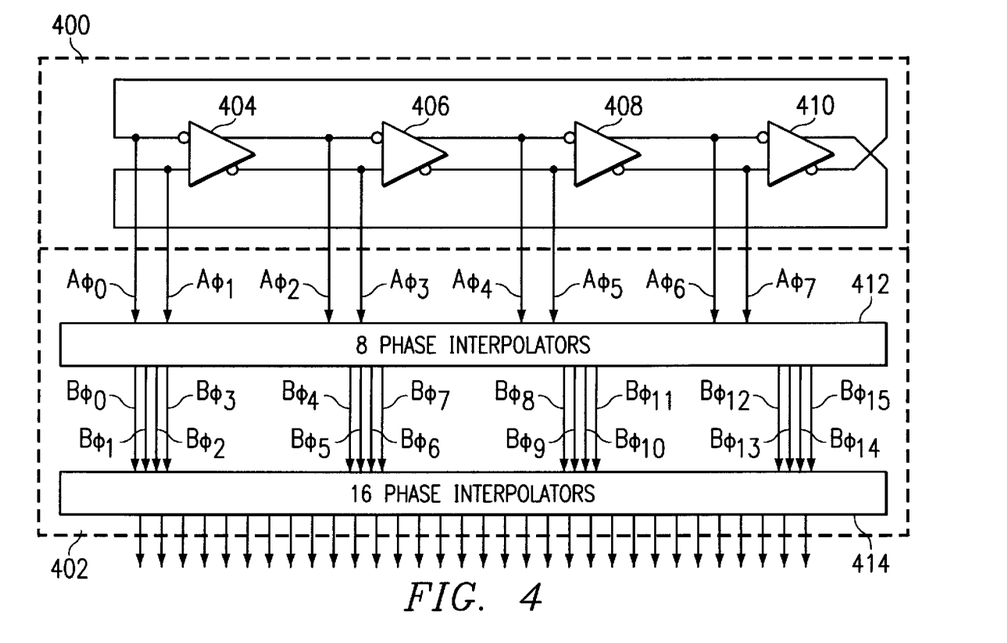
FIG. 4 is a block diagram of a ring oscillator and a phase interpolation unit of a digital clock recovery circuit in accordance with a preferred embodiment of the present invention.

With reference now to FIG. 4, a block diagram of a ring oscillator and a phase interpolation unit of a digital clock recovery circuit is depicted in accordance with a preferred embodiment of the present invention. In the depicted example, ring oscillator 400 is comprised of delay cells 404, 406, 408, and 410. Ring oscillator 400 is part of a frequency synthesizer and is used to generate clock signals with different phases. From each delay cell, two clock phases are generated. In the depicted example, ring oscillator 400 provides clock phases $A\phi_0$–$A\phi_7$, which are sent to phase interpolation unit 402. In particular, these clock phases are sent to array 412, which contains eight phase interpolators. Each phase interpolator takes a clock phase and generates two clock phases, resulting in sixteen clock phases being generated at the output of array 412. The sixteen clock phases are input into array 414, which contains sixteen phase interpolators. In turn, array 414 generates 32 clock phases which may be selected by a phase selection unit to output a recovered clock signal used to sample the incoming data.

Figure 5:
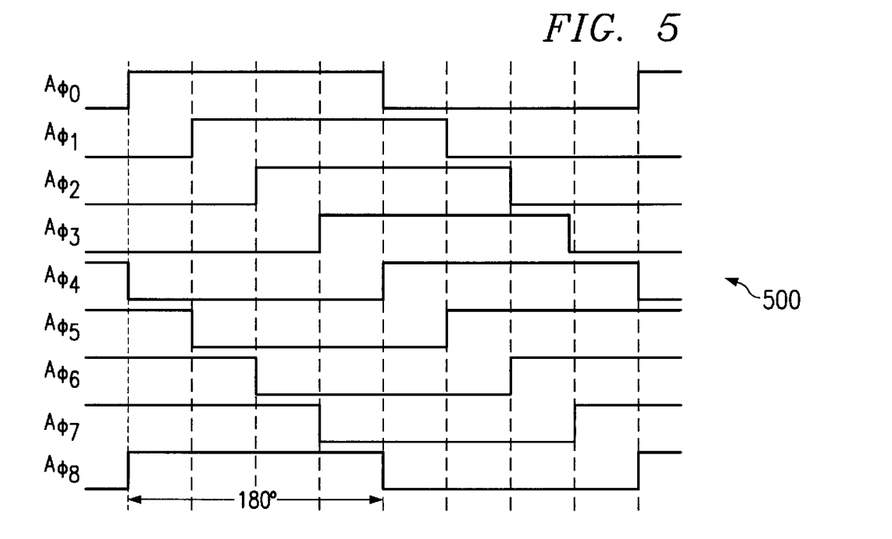
FIG. 5 is a timing diagram of clock signals from a voltage controlled oscillator in accordance with a preferred embodiment of the present invention.

Turning next to FIG. 5, timing diagram 500 of clock signals from a ring oscillator is depicted in accordance with a preferred embodiment of the present invention. Ring oscillator 400 in FIG. 4 generates clock phases $A\phi_0$–$A\phi_7$ as illustrated in FIG. 5. These clock phases have a 45 degree phase difference between successive clock outputs.

Figure 6:
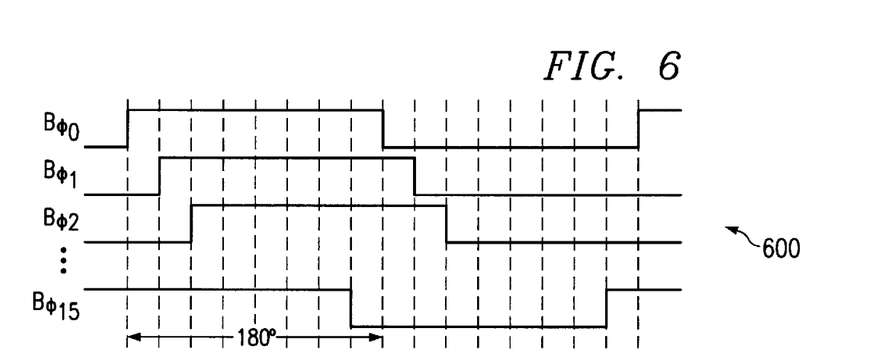
FIG. 6 is a timing diagram of outputs from a bank of eight phase interpolators in accordance with a preferred embodiment of the present invention.

With reference to FIG. 6, timing diagram 600 of outputs from a bank of eight phase interpolators is depicted in accordance with a preferred embodiment of the present invention. Array 412 in FIG. 4 generates sixteen clock phases $B\phi_0$–$B\phi_{15}$, with each phase having a 22.5 degree phase difference. These clock phases are in turn sent to an array of sixteen phase interpolators, which produces 32 clock phases each with an 11.25 degree phase difference between phases.

Figure 7:
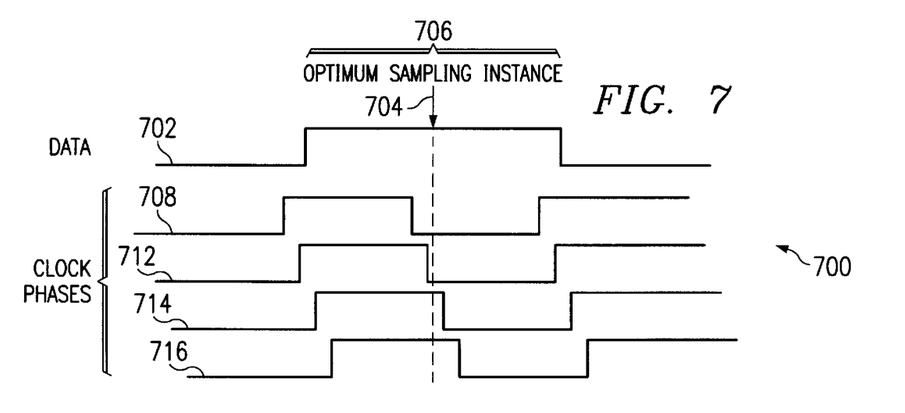
FIG. 7 is a timing diagram of clock phases and data in accordance with a preferred embodiment of the present invention.

With reference now to FIG. 7, timing diagram 700 of clock phases and data is depicted in accordance with a preferred embodiment of the present invention. Timing diagram 700 is an example of data and a clock phase relationship. Data signal 702 in timing diagram 700 has a optimal sampling instance 704 in data bit 706. Also illustrated are clock phase signals 708, 710, 712, and 714. Data signal 702 is a non-return to zero (NRZ) data. Therefore, one data bit is equal to one clock period, and optimal sampling instance 704 is in the middle of data bit 706. In the depicted example, phase signals 708, 710, 712, and 714 are a portion of 32 clock phases produced by array 414 in phase interpolation unit 402 in FIG. 4. In timing diagram 700, 11.25 degrees exist between clock phase signals 708 and 712, between clock phase signals 712 and 714, and between clock phase signals 714 and 716. The clock phase signal closest to the optimal sampling instance is selected to sample data. As data edges in data signal 702 vary in time with respect to the clock phases, a different phase clock signal is chosen to sample the data. In the depicted example, as the data edge in data signal 702 varies more than 5.625 degrees, a command is produced by the phase detector to switch phases. This command is typically filtered by the digital filter to average out random jitter in the data. When a selected number of up or down commands have been produced, the next phase has been chosen to sample the data. In the depicted example, clock phase signal 712 is the optimal clock phase for sampling data in data signal 702 because it is closest to the optimal sampling instance 704.

If the recovered clock signal leads the data, the phase selection unit delays the recovered clock signal by one phase step. In contrast, if the recovered clock signal lags the data, the phase selection unit advances the recovered clock signal. For example, if the current clock phase is clock phase signal 714, the clock phase lags optimal sampling instance 704. A comparison of this clock phase with the data signal at the phase detector would result in an up signal being sent to the digital filter. When a sufficient number of up signals have been sent, the digital filter will signal the phase selection unit to use clock phase signal 712 in place of clock phase signal 714.

Figure 8:
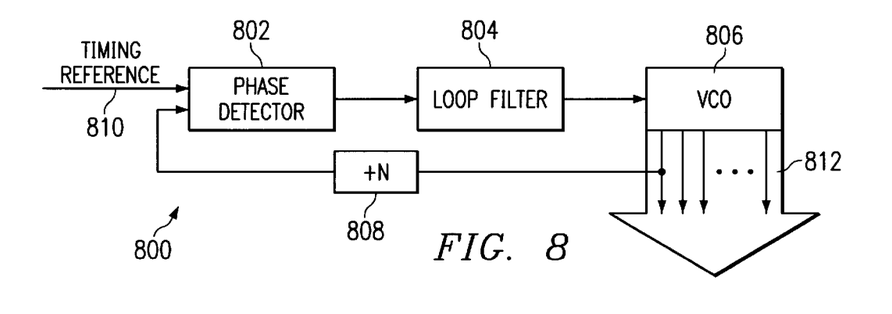
FIG. 8 is a diagram of a frequency synthesizer in accordance with a preferred embodiment of the present invention.

With reference now to FIG. 8, a diagram of frequency synthesizer 800 is depicted in accordance with a preferred embodiment of the present invention. Frequency synthesizer 800 includes a phase detector 802, a loop filter 804, a voltage controlled oscillator (VCO) 806, and a divide by N circuit 808 in the depicted example. Other components or circuits other than the depicted ones may be used to generate clock signals having different phase signals in accordance with a preferred embodiment of the present invention. Phase detector 802 includes an input 810 for receiving a timing reference signal. VCO 806 is connected to a phase interpolation unit (not shown) by bus 812, which includes a number of lines to carry the clock phase signals. Divide by N circuit 808 has a connection to one of the lines within bus 812 to complete the phase-locked loop synthesizer function.

Figure 9:
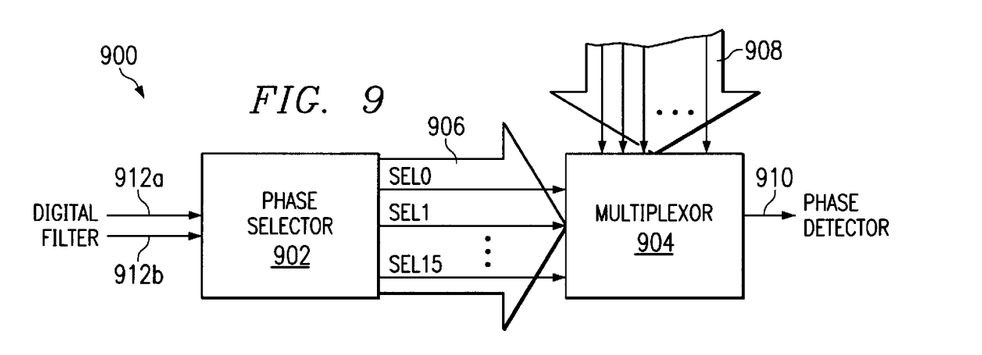
FIG. 9 is a block diagram of a phase selection unit in accordance with a preferred embodiment of the present invention.

Next in FIG. 9, a block diagram of a phase selection unit is depicted in accordance with a preferred embodiment of the present invention. Phase selection unit 900 includes a phase selector 902 and a multiplexor 904. Phase selector 902 controls multiplexor 904. Phase selector 902 generates phase selection signals that are sent to multiplexor 904 through bus 906, which contains a number of lines to carry the selection signals. The phase selection signals are used to select one of the clock phases input into multiplexor 904 along clock bus 908. Output 910 generates a recovered clock signal and also is coupled to the phase detector in the digital clock recovery circuit. Inputs 912*a* and 912*b* are connected to the output of the digital filter.

Figure 10A:
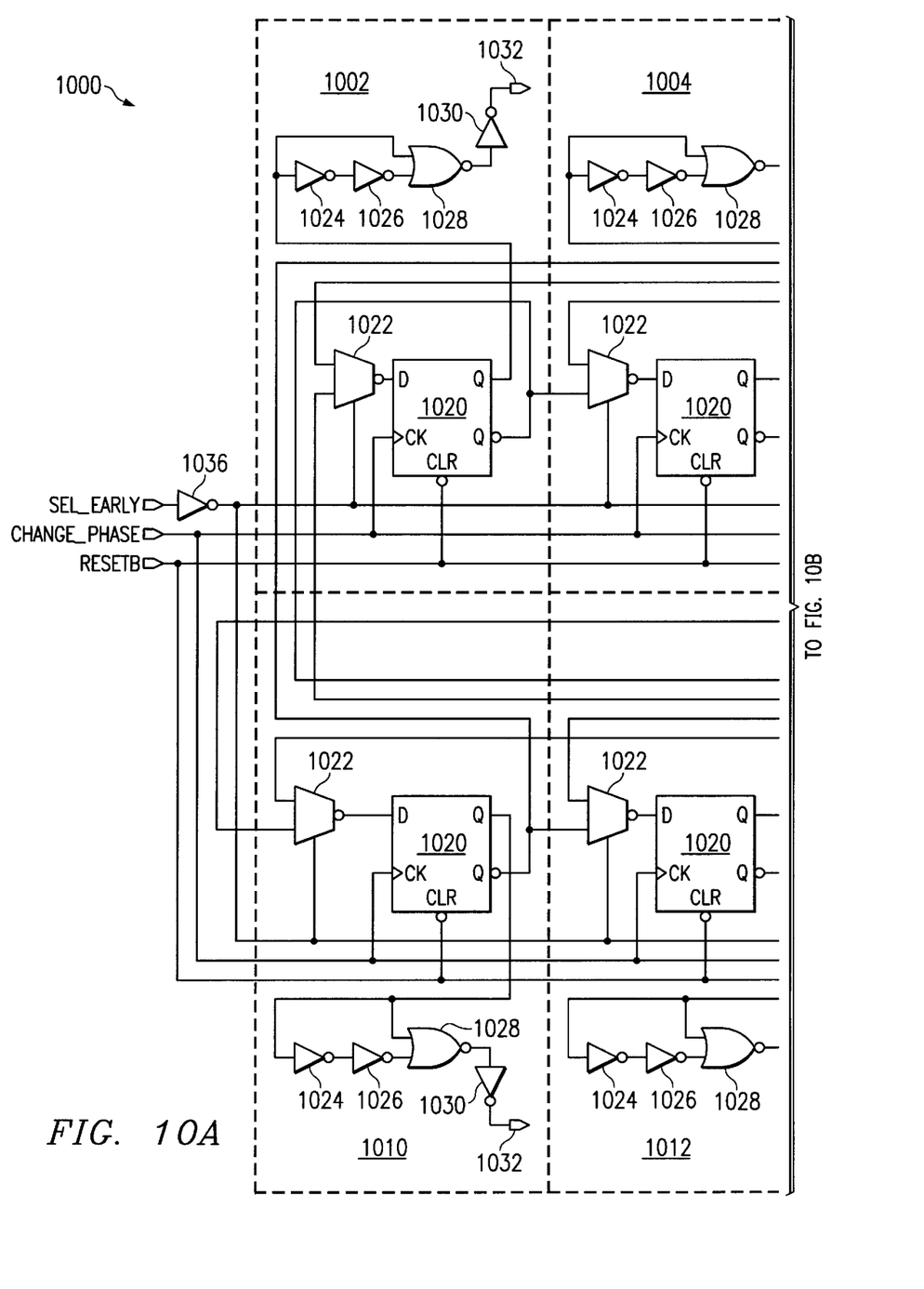
FIG. 10 is a schematic diagram of a eight phase selector in accordance with a preferred embodiment of the present invention.
Figure 10B:
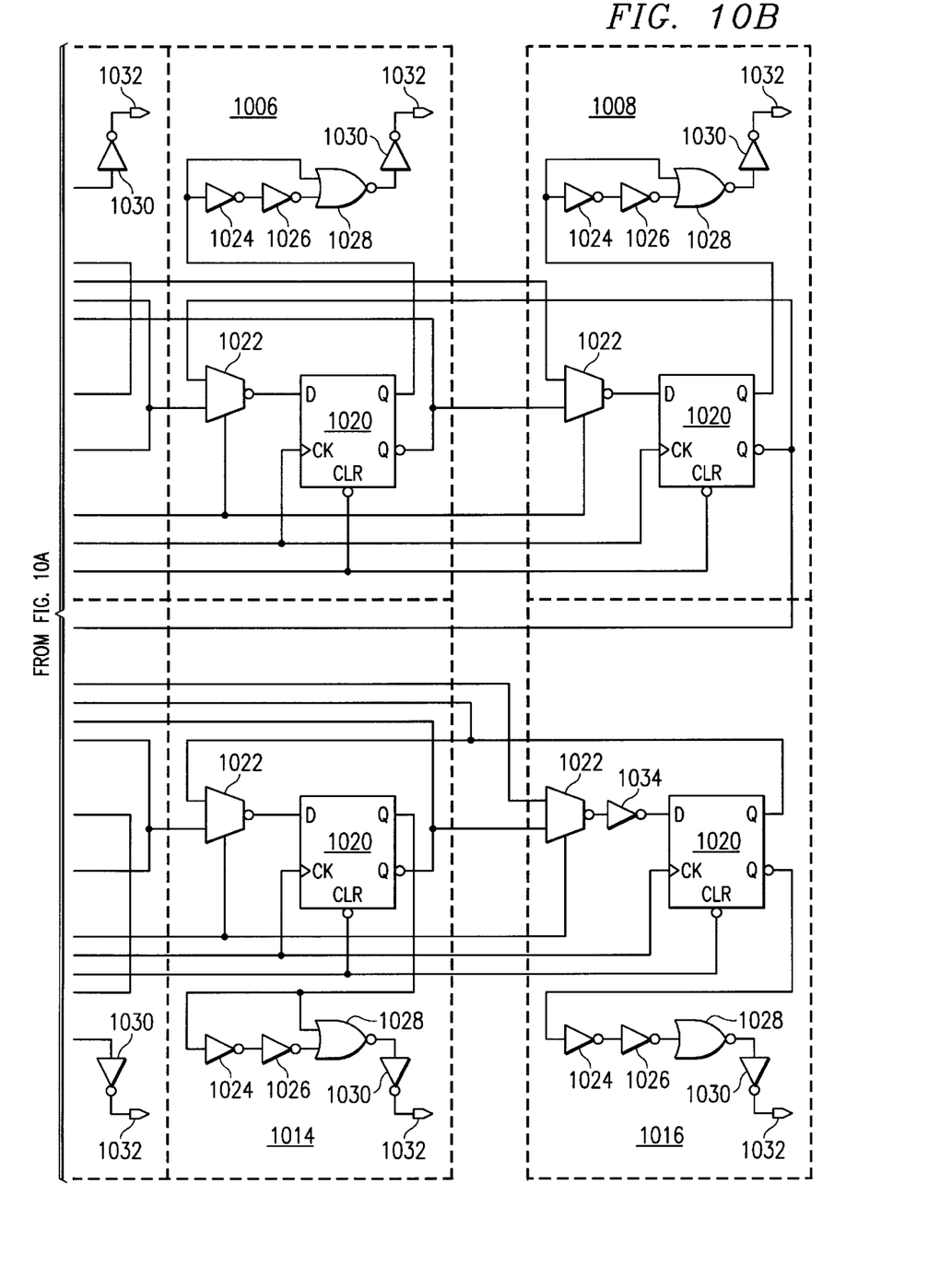

Next in FIG. 10, a schematic diagram of a phase selector with eight phases is depicted in accordance with a preferred embodiment of the present invention. Phase selector 1000 includes units 1002–1016, which are selected using inputs SEL_EARLY, CHANGE_PHASE, and RESETB. Each unit except unit 1016 includes a D flip-flop 1020, a multiplexor 1022, an inverter 1024, an inverter 1026, an OR gate 1028, an inverter 1030, and an output 1032. Unit 1016 includes an inverter 1034 in addition to the components found in the other units. Phase selector 1000 also includes an inverter 1036. The outputs 1032 are connected to the multiplexor in the phase selection unit and used to control the clock phase signal generated by the phase selection unit.

When phase selector 1000 is initially activated, a selection signal is generated at output 1032 in unit 1016. By applying a positive edge signal to input selection SEL_EARLY and logic high at input CHANGE_PHASE, a selection signal will be generated at output 1032 in unit 1002. When a positive edge signal is applied at input CHANGE_PHASE and a logic low at input SEL_EARLY, a selection signal is then generated at output 1032 in unit 1014. A signal applied to input RESETB results in a selection signal being generated at output 1032 in unit 1016 and is the starting point when initiating phase lock.

Figure 11:
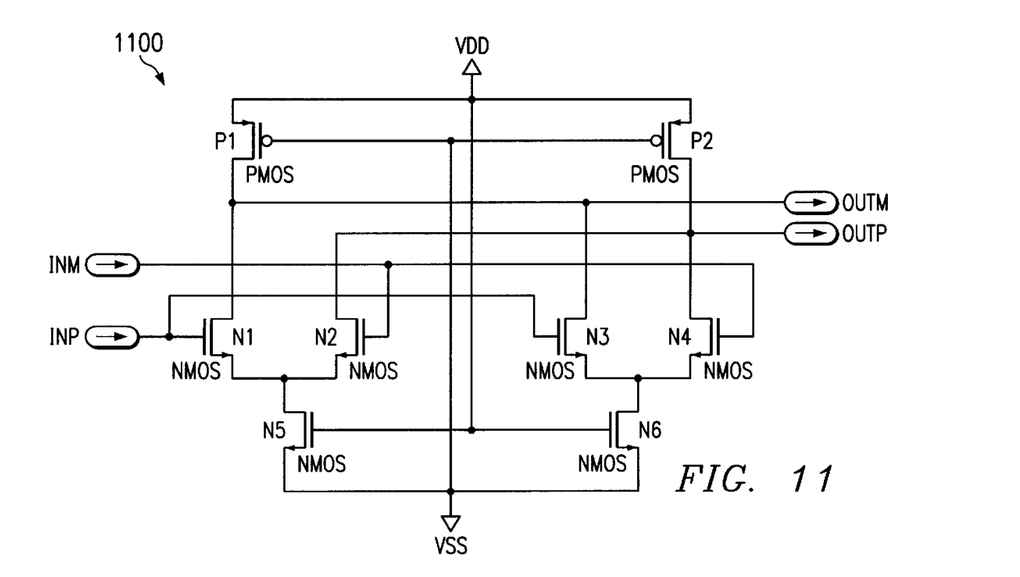
FIG. 11 is a schematic diagram of a phase interpolator in accordance with a preferred embodiment of the present invention.

In FIG. 11, a schematic diagram of a phase interpolator is depicted in accordance with a preferred embodiment of the present invention. Phase interpolator 1100 is a schematic diagram of a phase interpolator used within an array of phase interpolators within a phase interpolation unit. Phase interpolator 1100 includes transistors in N1–N6, which are N channel metal oxide semiconductor (NMOS) transistors. Additionally, phase interpolator circuit 1100 also contains transistors P1 and P2, which are P channel metal oxide semiconductor (PMOS) transistors. Complementary clock signals are input at inputs INM and INP. Outputs OUTM and OUTP provide the outputs that are connected to another array of phase interpolators or to a phase selection unit. Phase interpolator 1100 is powered by connecting the circuit to an upper power supply voltage, such as power supply voltage VDD, and a lower power supply voltage, such as power supply voltage. Phase interpolator 1100 requires no bias inputs in the depicted example.

Thus, high phase resolution in recovered clock signals in digital clock recovery circuits can be achieved without being limited by the speed of the technology or by the number of delay elements used. The present invention provides this advantage through phase interpolation to produce an arbitrary number of clock phases. This design also allows for the number of delay cells to be reduced within the voltage controlled oscillator, thus reducing power consumption of the voltage controlled oscillator.

The description of the preferred embodiment of the present invention has been presented for purposes of illustration and description, but is not limited to be exhaustive or limited to the invention in the form disclosed. Many modifications and variations will be apparent to those of ordinary skill in the art. That the embodiment was chosen and described in order to best explain the principles of the invention the practical application to enable others of ordinary skill in the art to understand the invention for various embodiments with various modifications as are suited to the particular use contemplated.

What is claimed is:

1. A method for recovering a clock signal, the method comprising:

receiving a reference clock signal;

generating a plurality of clock signals from the clock signal, the plurality of clock signals having a plurality of phases with a first phase difference between phases within the plurality of phases;

interpolating the plurality of clock signals to generate a second plurality of clock signals, wherein the second plurality of clock signals has a second plurality of phases with a second phase difference between phases within the plurality of phases; and selecting a clock signal from the second plurality of clock signals, wherein the clock signal forms a recovered clock signal.

2. The method of claim 1 further comprising:

receiving a data signal;

comparing the data signal to the recovered clock signal;

selecting another clock signal from the second plurality of clock signals in response to the recovered clock signal leading the data signal to form a new recovered clock signal; and selecting another clock signal from the second plurality of clock signals in response to the recovered clock signal lagging the data signal to form a new recovered clock signal.

3. The method of claim 1, wherein the data signal has an optimal sampling instance and wherein the step of comparing the data signal to the recovered clock signal comprises:

comparing the optimal sampling instance of the data signal to an edge of the recovered clock signal.

4. The method of claim 3, wherein the step of selecting another clock signal from the second plurality of clock signals in response to the recovered clock signal leading the data signal to form a new recovered clock signal comprises:

selecting another clock signal, from the second plurality of clock signals, having an edge closest to the optimal sampling instance.

5. The method of claim 4, wherein the step of selecting another clock signal from the second plurality of clock signals in response to the recovered clock signal lagging the data signal to form a new recovered clock signal comprises:

selecting another clock signal, from the second plurality of clock signals, having an edge closest to the optimal sampling instance.

6. The method of claim 1, wherein the step of generating a plurality of clock signals from the clock signal comprises:
generating a plurality of clock signals from the clock signal using a ring oscillator, the plurality of clock signals having a plurality of phases with a first phase difference between phases within the plurality of phases.

7. A digital clock recovery circuit comprising:
a phase detector having a first input, a second input, a first output, and a second output, wherein the first input is configured to receive a data signal;
a digital filter having a first input, a second output, a first output, and a second output, wherein the first input and the second input of the digital filter are connected to the first output and the second output of the phase detector;
a phase selection unit having a first input, a second input, a third input, and an output, wherein the first input and the second input of the phase selector are connected to the first output and the second output of the digital filter and wherein the output of the phase selection unit is connected to the second input of the phase detector;
a frequency synthesizer having an input and an output, wherein the input of the frequency synthesizer is configured to receive a timing reference signal and wherein the frequency synthesizer creates a first number clock output signals at the output, each clock output signal having a phase difference from another output clock signal within the first number of clock output signals, wherein a first number of clock phases for the plurality of clock output signals are generated; and
a phase interpolation unit having an input and an output, the input of the phase interpolation unit being connected to the output of the frequency synthesizer and the output of the phase interpolation unit being connected to the third input of the phase selection unit, wherein the phase interpolation unit increases the first number of clock output signals generated by the frequency synthesizer to generate a second number of clock output signals, each clock output signal in the second number of clock output signals having a phase difference from another output clock signal within the second number of clock output signals and wherein the phase selection unit selects a clock output signal from the second number of clock output signals.

8. The digital clock recovery circuit of claim 7, wherein the frequency synthesizer comprises four differential delay cells, each of the four differential delay cells having a pair of outputs to form eight outputs and wherein the phase interpolation unit comprises an array of eight phase interpolators, wherein each of the eight phase interpolators are connected to one of the eight outputs.

9. The digital clock recovery circuit of claim 7, wherein the phase interpolation unit comprises two arrays of phase interpolators.

10. The digital clock recovery circuit of claim 9, wherein the second number of clock signals is four times the number of clock signals.

11. The digital clock recovery circuit of claim 7, wherein the frequency synthesizer comprises:
a phase detector having a first input, a second input, and an output, wherein the first input is configured to receive a timing reference signal;
a voltage controlled oscillator including a plurality of delay units, the voltage controlled oscillator having an input and an output, the input of the voltage controlled oscillator being connected to the output of the phase detector; and
a divide by N circuit having an input and an output, the input of the divide by N circuit being connected to the output of the voltage controlled oscillator and the output of the divide by N circuit being connected to the second input of the phase detector.

12. The digital clock recovery circuit of claim 11, wherein the frequency synthesizer further comprises:
a loop filter, the loop filter having an input connected to the output of the phase detector and having an output connected to the input of the voltage controlled oscillator, wherein the loop filter connects the output of the phase detector to the input of the voltage controlled oscillator.

13. An apparatus for recovering a clock signal, the apparatus comprising:
reception means for receiving a reference clock signal;
clock generation means for generating a plurality of clock signals from the reference clock signal using a ring oscillator having a plurality of phases with a first phase difference between phases within the plurality of phases;
interpolation means for interpolating the plurality of clock signals to generate a second plurality of clock signals, wherein the second plurality of clock signals has a second plurality of phases with a second phase difference between phases within the plurality of phases; and
selection means for selecting a clock signal from the second plurality of clock signals, wherein the clock signal forms a recovered clock signal.

14. The apparatus of claim 13 further comprising:
data reception means for receiving a data signal;
comparison means comparing the data signal to the recovered clock signal;
second selection means for selecting another clock signal from the second plurality of clock signals in response to the recovered clock signal leading the data signal to form a new recovered clock signal; and
third selection means for selecting another clock signal from the second plurality of clock signals in response to the recovered clock signal lagging the data signal to form a new recovered clock signal.

15. The apparatus of claim 13, wherein the data signal has an optimal sampling instance and wherein the step of comparing the data signal to the clock signal comprises:
comparing the optimal sampling instance of the data signal to an edge of the recovered clock signal.

16. The apparatus of claim 15, wherein the second selection means comprises means for selecting another clock signal, from the second plurality of clock signals, having an edge closest to the optimal sampling instance.

17. The apparatus of claim 16, wherein the third selection means comprises means for selecting another clock signal, from the second plurality of clock signals, having an edge closest to the optimal sampling instance.

18. The apparatus of claim 13, wherein the clock generation means comprises a plurality of delay cells.

19. The apparatus of claim 18, wherein the plurality of delay cells is a ring oscillator.

20. The apparatus of claim 14, wherein the comparison means is a phase detector.

21. The apparatus of claim 13, wherein the phase interpolation means comprises an array of phase interpolators.

22. A clock recovery circuit comprising:

a plurality of delay cells coupled in series and having an input and an output, the input being connected to a first of the plurality of delay cells, the input being configured to receive a reference clock signal, wherein the plurality of delay cells generate a plurality of clock signals having a plurality of phases at the output;

phase interpolation means having an input and an output, the input of the phase interpolation means being coupled to the output of the plurality of delay cells, wherein the phase interpolation means generates a second plurality of clock signals having a second plurality of phases at the output of the phase interpolation means; and phase selection means for selecting a clock signal from the plurality of clock signals.

23. The clock recovery circuit of claim 22, wherein the plurality of delay cells comprises a plurality of differential delay cells in a ring configuration.

* * * * *